(12) United States Patent
Du et al.

(10) Patent No.: US 11,289,674 B2
(45) Date of Patent: Mar. 29, 2022

(54) ORGANIC LIGHT-EMITTING DIODE DISPLAY PANEL, MANUFACTURING METHOD THEREOF, AND ORGANIC LIGHT-EMITTING DIODE DISPLAY DEVICE

(71) Applicant: Wuhan China Star Optoelectronics Semiconductor Display Technology Co., Ltd., Wuhan (CN)

(72) Inventors: Xiao Du, Wuhan (CN); Xiangzhi Kong, Wuhan (CN); Munjae Lee, Wuhan (CN); Tao Sun, Wuhan (CN); Xianjie Li, Wuhan (CN); Qian Jiang, Wuhan (CN); Yungsheng Chen, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 133 days.

(21) Appl. No.: 16/769,251

(22) PCT Filed: Oct. 15, 2019

(86) PCT No.: PCT/CN2019/111329
§ 371 (c)(1),
(2) Date: Jun. 3, 2020

(87) PCT Pub. No.: WO2021/012413
PCT Pub. Date: Jan. 28, 2021

(65) Prior Publication Data
US 2021/0408437 A1 Dec. 30, 2021

(30) Foreign Application Priority Data
Jul. 24, 2019 (CN) .......................... 201910669498.3

(51) Int. Cl.
*H01L 51/00* (2006.01)
*H01L 27/32* (2006.01)
(Continued)

(52) U.S. Cl.
CPC ........ *H01L 51/5225* (2013.01); *H01L 27/326* (2013.01); *H01L 27/3234* (2013.01);
(Continued)

(58) Field of Classification Search
CPC ............ H01L 51/5225; H01L 27/3234; H01L 27/326; H01L 51/001; H01L 51/0011;
(Continued)

(56) References Cited

U.S. PATENT DOCUMENTS

2020/0251539 A1* 8/2020 Fu .................... H01L 27/3288
2021/0376004 A1* 12/2021 Li ..................... H01L 51/5262

* cited by examiner

*Primary Examiner* — David Vu
*Assistant Examiner* — Brandon C Fox

(57) ABSTRACT

An organic light-emitting diode (OLED) display panel and a manufacturing method thereof are provided. The OLED display panel includes an array substrate and a cathode structure. The cathode structure includes a metal film layer. The metal film layer includes a first metal film layer and a second metal film layer. The first metal film layer is positioned within the first active area and the second metal film layer is positioned within the second active area. Different regions of the metal film layer in the cathode structure are adjusted to different thicknesses, so that different regions have different light transmittances, which is beneficial to increase screen-to-body ratio.

20 Claims, 5 Drawing Sheets

(51) Int. Cl.
*H01L 51/52* (2006.01)
*H01L 51/56* (2006.01)
*H04N 5/225* (2006.01)

(52) U.S. Cl.
CPC ........ *H01L 51/001* (2013.01); *H01L 51/0011* (2013.01); *H01L 51/0021* (2013.01); *H01L 51/5262* (2013.01); *H01L 51/56* (2013.01); *H01L 2227/323* (2013.01); *H01L 2251/305* (2013.01); *H01L 2251/308* (2013.01); *H01L 2251/558* (2013.01); *H04N 5/2257* (2013.01)

(58) Field of Classification Search
CPC . H01L 51/0021; H01L 51/5262; H01L 51/56; H01L 2227/323; H01L 2251/305; H01L 2251/308; H01L 2251/558; H04N 5/2257
USPC .......................................................... 257/40
See application file for complete search history.

ORGANIC LIGHT-EMITTING DIODE DISPLAY PANEL, MANUFACTURING METHOD THEREOF, AND ORGANIC LIGHT-EMITTING DIODE DISPLAY DEVICE

RELATED APPLICATIONS

This application is a National Phase of PCT Patent Application No. PCT/CN2019/111329 having International filing date of Oct. 15, 2019, which claims the benefit of priority of Chinese Patent Application No. 201910669498.3 filed on Jul. 24, 2019. The contents of the above applications are all incorporated by reference as if fully set forth herein in their entirety.

FIELD AND BACKGROUND OF THE INVENTION

The present disclosure relates to the field of display technologies, and more particularly, to an organic light-emitting diode display panel, a manufacturing method thereof, and an organic light-emitting diode display device.

Cathode structures of existing organic light-emitting diode (OLED) display panels usually employ translucent cathodes. Cathode materials are usually alloy metal film layers having uniform film thicknesses, for example, alloy metals comprising metallic magnesium and metallic silver, etc. Because film thicknesses of translucent cathodes are inversely proportional to light transmittance and are proportional to conductivity, this means that the thinner the alloy metal film layer is, the better the light transmittance of the cathode structures and the worse the light guiding properties. The thicker the alloy metal film layer is, the worse the light transmittance of the cathode structure and the better the light guiding property. In general cases, light transmittances of cathode structures are in the range of 50%-80%, and light transmittances are low. Thicknesses of alloy metal film layers must be reduced in order to increase light transmittance. However, this method will affect display optical properties of OLED display panels and electrical conductivity of alloy metal film layers. Furthermore, transmittances of different regions of OLED display panels are same.

In addition, existing OLED display panels have notch structures. Front cameras are fixed at the notch structure. Because front cameras occupy part of a plane of OLED display panels, active areas of screens cannot be further enlarged. Moreover, display function cannot be implemented in the area occupied by front cameras, resulting in a relatively low screen-to-body ratio of the OLED display, which does not conform to current trends.

In summary, it is necessary to provide a novel OLED display panel, a manufacturing method thereof, and an OLED display device to solve the above technical problems.

Technical Problems

The present disclosure provides an OLED display panel, a manufacturing method thereof, and an OLED display device, which solve technical problems that transmittances of cathode structures of existing OLED display panels are low and display function cannot be implemented in areas of OLED screens that correspond to cameras, resulting in a lower screen-to-body ratio.

SUMMARY OF THE INVENTION

In order to solve the above-mentioned problems, the technical schemes provided by the present disclosure are as follows:

An embodiment of the present disclosure provides an organic light-emitting diode (OLED) display panel, comprising a first active area and a second active area adjacent to the first active area, wherein the first active area is a main structure of the OLED display, the second active area corresponds to a position of a functional device of the OLED display panel, and the OLED display panel comprises an array substrate and a cathode structure that is disposed on the array substrate;

wherein the cathode structure comprises a metal film layer, the metal film layer comprises a first metal film layer and a second metal film layer, the first metal film layer is positioned within the first active area, the second metal film layer is positioned within the second active area, at least the second metal film layer of the metal film layer is subjected to a thinning treatment, and a thickness of the second metal film layer is less than or equal to a thickness of the first metal film layer.

According to the embodiment of the present disclosure, the cathode structure further comprises a conductive film layer disposed on the first metal film layer and the second metal film layer.

According to the embodiment of the present disclosure, a thickness of the conductive film layer is 50-5000 Å.

According to the embodiment of the present disclosure, the cathode structure further comprises an optical compensation film layer and a cover film layer that are laminated on the conductive film layer in sequence.

According to the embodiment of the present disclosure, the cathode structure further comprises a buffer layer disposed at a bottom of the first metal film layer and the second metal film layer, and the buffer layer corresponds to the first active area and the second active area.

According to the embodiment of the present disclosure, the functional device comprises a camera that is disposed at a back of the second active area.

According to the embodiment of the present disclosure, a thickness of the first metal film layer is 50-300 Å, and a thickness ratio of a thickness of the second metal film layer to the thickness of the first metal film layer is between 0.1% to 99.9%.

According to the embodiment of the present disclosure, a shape of the second active area is a notch, a U shape, or a water-drop shape.

According to the embodiment of the present disclosure, the OLED display further comprises a flexible circuit board, on which an integrated circuit chip is disposed.

An embodiment of the present disclosure provides a manufacturing method of an organic light-emitting diode (OLED) display panel, comprising:

a step S10 of forming an array substrate that comprises an adjacent first active area and a second active area; and a step S20 of forming a first metal film layer and a second metal film layer on the array substrate using a first metal mask by thermal evaporation or electron beam evaporation technique in vacuo, wherein the first metal film layer and the second metal film layer jointly form a metal film layer, the first metal film layer is positioned within the first active area, the second metal film layer is positioned within the second active area, and at least the second metal film layer of the metal film layer is subjected to a thinning treatment so that a thickness of the second metal film layer is less than or equal to a thickness of the first metal film layer.

According to the embodiment of the present disclosure, further comprising a step S30 of forming a conductive film layer on the first metal film layer and the second metal film layer by physical vapor deposition method.

According to the embodiment of the present disclosure, a material of the conductive film layer is selected from the group consisting of indium tin oxide, indium oxide-zinc oxide composite, aluminum-doped zinc oxide, molybdenum-doped zinc oxide, and a combination thereof.

According to the embodiment of the present disclosure, further comprising a step S40 of forming an optical compensation film layer and a cover film layer on the conductive film layer in sequence.

According to the embodiment of the present disclosure, the step S10 further comprises:

a step S101 of forming a buffer layer on the array substrate using a second metal mask by thermal evaporation or electron beam evaporation technique in vacuo, wherein the buffer layer corresponds to the first active area and the second active area.

According to the embodiment of the present disclosure, the buffer layer is made of metallic silver, metallic germanium, metallic magnesium, or metallic aluminum.

An embodiment of the present disclosure provides an organic light-emitting diode (OLED) display device, comprising an OLED display panel, wherein the OLED display panel comprises a first active area and a second active area adjacent to the first active area, the first active area is a main structure of the OLED display, the second active area corresponds to a position of a functional device of the OLED display panel, and the OLED display panel comprises an array substrate and a cathode structure that is disposed on the array substrate;

wherein the cathode structure comprises a metal film layer, the metal film layer comprises a first metal film layer and a second metal film layer, the first metal film layer is positioned within the first active area, the second metal film layer is positioned within the second active area, at least the second metal film layer of the metal film layer is subjected to a thinning treatment, and a thickness of the second metal film layer is less than or equal to a thickness of the first metal film layer.

According to the embodiment of the present disclosure, the cathode structure further comprises a conductive film layer disposed on the first metal film layer and the second metal film layer.

According to the embodiment of the present disclosure, the cathode structure further comprises an optical compensation film layer and a cover film layer that are laminated on the conductive film layer in sequence.

According to the embodiment of the present disclosure, the cathode structure further comprises a buffer layer disposed at a bottom of the first metal film layer and the second metal film layer, and the buffer layer corresponds to the first active area and the second active area.

According to the embodiment of the present disclosure, the functional device comprises a camera that is disposed at a back of the second active area.

Beneficial Effects:

Beneficial effects of the present disclosure are that different regions of the metal film layer in the cathode structure are adjusted to different thicknesses and a conductive film layer is added to compensate a conductivity of the metal film layer, so that the OLED display panel, the manufacturing method thereof, and the OLED display device can achieve different light transmittances in different regions and achieve a conductivity of the existing cathode structure. In addition, the cathode structure can be applied to under-screen camera technologies, which is beneficial to increase screen-to-body ratio of the OLED display.

BRIEF DESCRIPTION OF THE SEVERAL VIEWS OF THE DRAWINGS

In order to illustrate technical solutions in the embodiments or in the prior art more clearly, the accompanying drawings required in the description of the embodiments or the prior art are introduced briefly hereafter. It is obvious that the accompanying drawings in the following description are merely part of the embodiments of the present disclosure. People with ordinary skills in the art can obtain other drawings without making inventive efforts.

DESCRIPTION OF SPECIFIC EMBODIMENTS OF THE INVENTION

In the following detailed description, reference is made to the accompanying figures, in which various examples are shown by way of illustration. In this regard, directional terminology mentioned in the present disclosure, such as "top", "bottom", "front", "back", "left", "right", "inner", "outer", "lateral", etc., is used with reference to the orientation of the figures being described. Therefore, the directional terminology is used for purposes of illustration and is not intended to limit the present invention. In the accompanying figures, units with similar structures are indicated by the same reference numbers.

The present disclosure is directed to organic light-emitting diode (OLED) display panel, manufacturing method thereof, and OLED display device in the prior art, in which transmittance of cathode structures is low and the display function cannot be implemented in areas of OLED screens that correspond to cameras, resulting in a lower screen-to-body ratio. The present embodiments can solve these defects.

Embodiment I

Figure 1A:
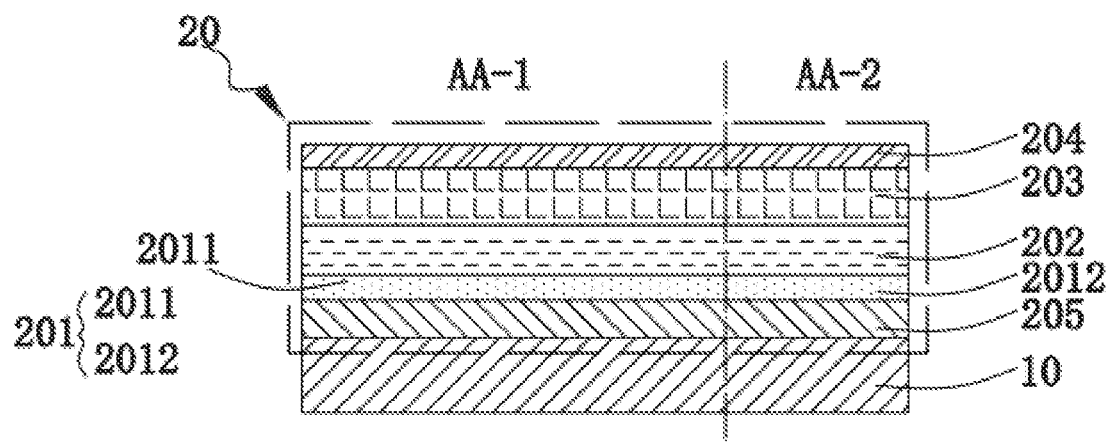
FIG. 1A is a schematic cross-sectional view of an organic light-emitting diode (OLED) display panel according to Embodiment I of the present disclosure.
Figure 1B:
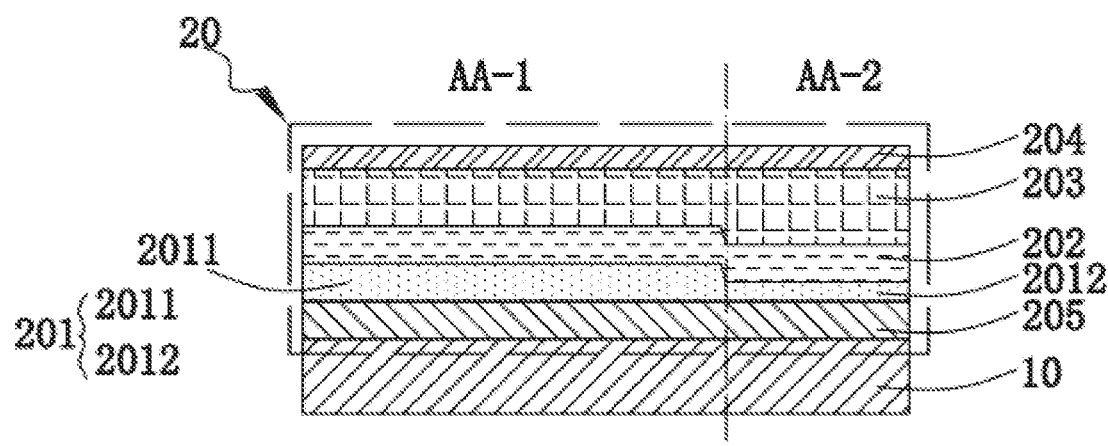
FIG. 1B is a schematic cross-sectional view of another OLED display panel according to Embodiment I of the present disclosure.
Figure 2:
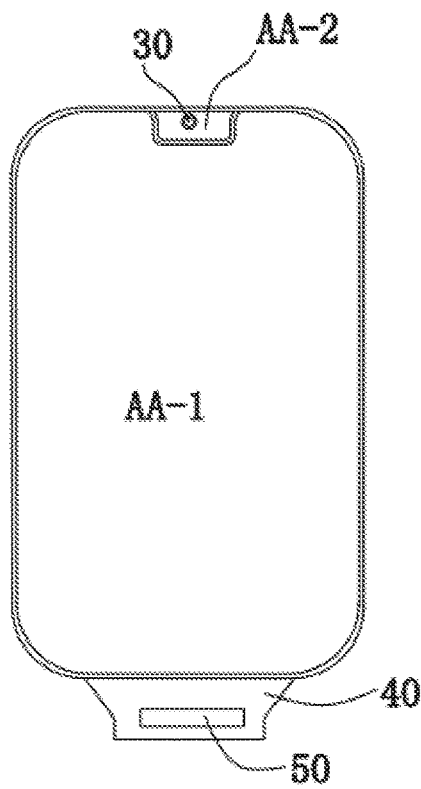
FIG. 2 is a front structural view showing an OLED display panel according to Embodiment I of the present disclosure.

As shown in FIG. 1A, FIG. 1B and FIG. 2, an OLED display panel provided by an embodiment of the present disclosure has a first active area AA-1 and a second active area AA-2 adjacent to the first active area AA-1. The first active area AA-1 is a main structure of the OLED display and is configured to display most of a screen picture. The second active area AA-2 corresponds to a position of a functional device of the OLED display screen. The functional device may be a front camera, an earpiece, an infrared sensor, etc., and is used for displaying a small area of the screen picture.

The OLED display panel comprises an array substrate 10 and a cathode structure 20 that is disposed on the array substrate 10. Understandably, the array substrate 10 may further include a glass substrate (not shown) at the bottom of the array substrate 10. A thin film transistor (TFT) array layer, an interlayer dielectric layer, a planarization layer, a pixel defining layer, a light emitting layer, an anode layer, and the like, from bottom to top, may be laminated between the glass substrate and the cathode structure 20, which is a prior art and is not described herein in detail. The cathode structure 20 is disposed on a side of the pixel defining layer that is away from the glass substrate.

The cathode structure 20 includes a metal film layer 201. The metal film layer 201 may be an alloy metal layer formed by metallic magnesium (Mg) and metallic silver (Ag), or an alloy metal layer formed of other materials. The metal film layer 201 includes a first metal film layer 2011 and a second metal film layer 2012. The first metal film layer 2011 is positioned within the first active area AA-1 and the second metal film layer 2012 is positioned within the second active area AA-2. At least the second metal film layer 2012 of the metal film layer 201 is subjected to a thinning treatment, so that a thickness of the second metal film layer 2012 is less than or equal to a thickness of the first metal film layer 2011.

Understandably, there are two cases, in which the first case is that, as shown in FIG. 1A, the first metal film layer 2011 and the second metal film layer 2012 are subjected to a uniform thinning treatment. The thickness of the first metal film layer 2011 is equal to the thickness of the second metal film layer 2012. Because a film thickness of the metal film layer 201 is inversely proportional to a light transmittance, in this case, a light transmittance of the second metal film layer 2012 is equal to a light transmittance of the first metal film layer 2011. However, the light transmittance of the first metal film layer 2011 and the light transmittance of the second metal film layer 2012 are increased compared to those before the thinning treatment. In the second case, as shown in FIG. 1B, only the second metal film layer 2012 is subjected to a thinning treatment, so that a thickness of the thinned second metal film layer 2012 is less than the thickness of the first metal film layer. In this case, the light transmittance of the second metal film layer 2012 is greater than the light transmittance of the first metal film layer 2011.

Specifically, the thickness of the first metal film layer 2011 is 50-300 Å. A thickness ratio of the thickness of the second metal film layer 2012 to the thickness of the first metal film layer 2011 is between 0.1% to 99.9%. The thickness of the second metal film layer 2012 can be any of 20 Å, 30 Å, 40 Å, 50 Å, 80 Å, 90 Å, 130 Å, 150 Å, 190 Å, 250 Å, and 290 Å. It is noted that the thickness ratio of the thickness of the first metal film layer 2011 to the thickness of the second metal film layer 2012 can be adjusted according to specific needs. The embodiments of the present disclosure should not be limited thereto.

Furthermore, because the film thickness of the metal film layer 201 is proportional to conductivity, the conductivity of the second metal film layer 2012 is less than the conductivity of the first metal film layer 2011. In order to overcome this defect, the cathode structure 20 further includes a conductive film layer 202. The conductive film layer 202 is disposed on the first metal film layer 2011 and the second metal film layer 2012. Both the first metal film layer 2011 and the second metal film layer 2012 are each provided with the conductive film layer 202 to compensate for insufficient conductivity of the second metal film layer 2012 due to reduction in thickness. In the meantime, high light transmittance and high conductivity of the cathode structure 20 are achieved. In the embodiment, a thickness of the conductive film layer 202 can be consistent at various positions, so that the cathode structure 20 can be planarized. It is understood that in other embodiments, the thickness of the conductive film layer 202 disposed on the second metal film layer 2012 can be greater than the thickness of the conductive film layer 202 disposed on the first metal film layer 2011, such that the conductivity of the cathode structure 20 corresponding to the first active area AA-1 and the second active area AA-2 is balanced.

Specifically, the thickness of the conductive film layer 202 is 50-5000 Å. The conductive film layer 202 is a transparent metal oxide film. A material of the conductive film layer 202 may be indium tin oxide, indium oxide-zinc oxide composite, aluminum-doped zinc oxide, and molybdenum-doped zinc oxide, and one or more combination thereof. The material of the conductive film layer 202 may also be other types of transparent conductive oxides.

Furthermore, an optical compensation film layer 203 and a cover film layer 204 are laminated on the conductive film layer 202 in sequence. The optical compensation film layer 203 covers the metal film layer 201 and is used for increasing brightness of light. The cover film layer 204 is disposed on the optical compensation film layer 203 to protect the cathode structure 20 from damage on the one hand, and to further planarize the cathode structure 20 on the other hand.

Furthermore, a buffer layer 205 is further disposed on a bottom of the first metal film layer 2011 and the second metal film layer 2012. The buffer layer 205 corresponds to the first active area AA-1 and the second active area AA-2, and is used for supporting the metal film layer 201. Specifically, the buffer layer 205 is disposed between the array substrate and the metal film layer 201. The buffer layer 205 is a metal film. A material of the buffer layer 205 may be one of metallic silver (Ag), metallic germanium (Yb), metallic magnesium (Mg), and metallic aluminum (Al). The material of the buffer layer 205 may also be other types of metals.

Because the cathode structure 20 has different optical transmittances in different regions, the cathode structure 20 can be applied to under-screen camera technologies. Please refer to FIG. 2 again, the OLED display panel further includes a camera 30. The camera 30 is disposed at a back of the second active area AA-2. In the embodiment of the present disclosure, the second active area AA-2 is positioned at the top middle position of the first active area AA-1. In other embodiments, the second active area AA-2 may also be located at any position of the first active area AA-1. A shape of the second active area AA-2 may be a notch, a U shape, a water-drop shape, or the like. Because light transmittance of the cathode structure 20 corresponding to the second active area AA-2 is high, the second active area AA-2 has a greater light transmittance. On the one hand, the second active area AA-2 can implement a display function, thereby enabling the entire screen of the OLED display panel to display a screen picture and increasing the screen-to-body ratio, such that the screen-to-body ratio is closer to 100% and is beneficial to achieve a full-screen display. On the other hand, the camera 30 positioned at the back of the second active area AA-2 can implement a photographing function through the display panel.

The OLED display panel further includes a flexible circuit board 40. An integrated circuit (IC) chip 50 is disposed on the flexible circuit board 40 to provide a driving signal for the screen picture of the OLED display panel.

Embodiment II

Figure 3:
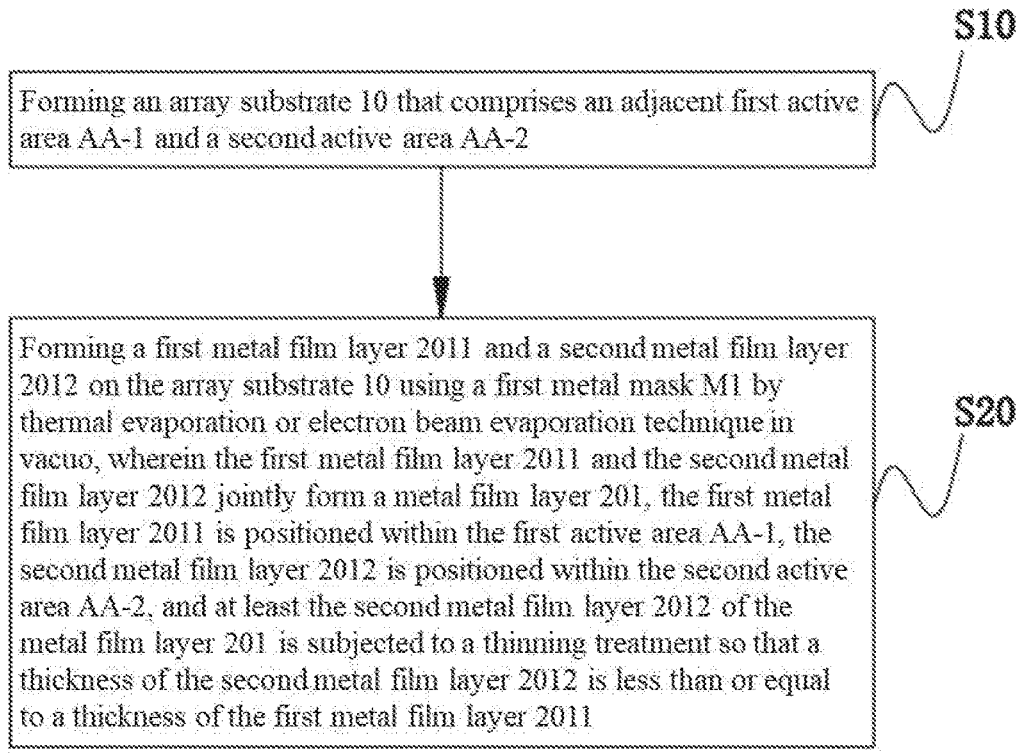
FIG. 3 is a flowchart of a manufacturing method of an OLED display panel according to Embodiment II of the present disclosure.

As shown in FIG. 3, a manufacturing method of an OLED display panel according to an embodiment of the present disclosure includes, a step S10 of forming an array substrate 10 that comprises an adjacent first active area AA-1 and a second active area AA-2.

Figure 4A:
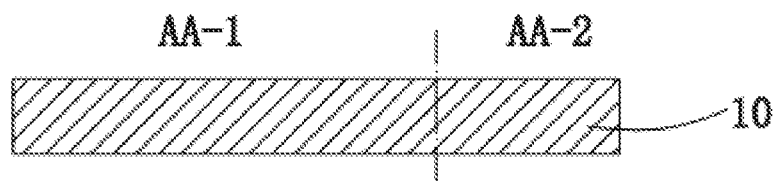
FIGS. 4A, 4B, 4C, 4D and 4E are schematic views of a manufacturing method of an OLED display panel according to Embodiment II of the present disclosure.

Specifically, as shown in FIG. 4A, the step S10 further includes providing a glass substrate, and forming a thin film transistor array layer, an interlayer dielectric layer, a planarization layer, a pixel defining layer, a light emitting layer, an anode layer, and the like, from bottom to top, on the glass substrate in sequence, which is a prior art and is not described herein in detail. The first active area AA-1 is disposed adjacent to the second active area AA-2. A camera and other components are fixed at the back of the second active area AA-2.

Figure 4B:
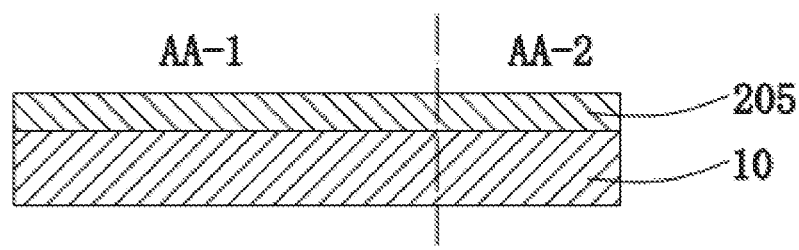
Figure 5A:
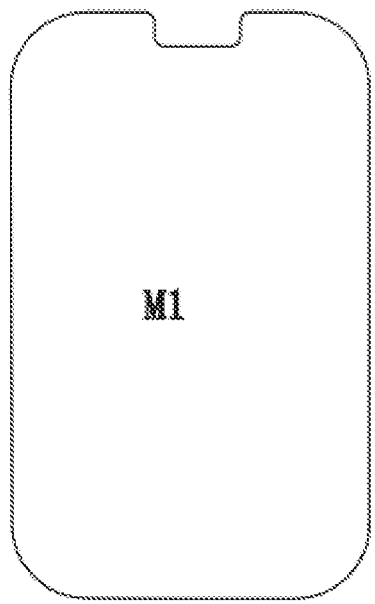
FIG. 5A is a schematic structural view of a first metal mask according to Embodiment II of the present disclosure.
Figure 5B:
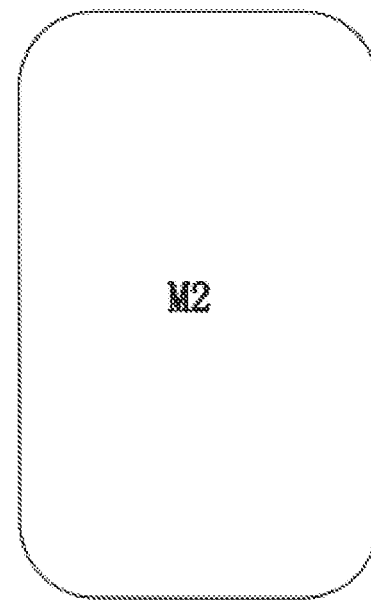
FIG. 5B is a schematic structural view of a second metal mask according to Embodiment II of the present disclosure.

Furthermore, as shown in FIG. 4B, the step S10 may further include a step S101 of forming a buffer layer 205 on the array substrate 10 using a second metal mask M2 by thermal evaporation or electron beam evaporation technique in vacuo, wherein the buffer layer 205 corresponds to the first active area AA-1 and the second active area AA-2, and is used for supporting a subsequently formed metal film layer 201. Specifically, a shape of the second metal mask M2 is as shown in FIG. 5B, and an entire surface of the second metal mask M2 is a light-transmitting region.

A step S20 of forming a first metal film layer 2011 and a second metal film layer 2012 on the array substrate 10 using a first metal mask M1 by thermal evaporation or electron beam evaporation technique in vacuo, wherein the first metal film layer 2011 and the second metal film layer 2012 jointly form the metal film layer 201, the first metal film layer 2011 is positioned within the first active area AA-1, the second metal film layer 2012 is positioned within the second active area AA-2, and at least the second metal film layer 2012 of the metal film layer 201 is subjected to a thinning treatment so that a thickness of the second metal film layer 2012 is less than or equal to a thickness of the first metal film layer 2011.

Figure 4C:
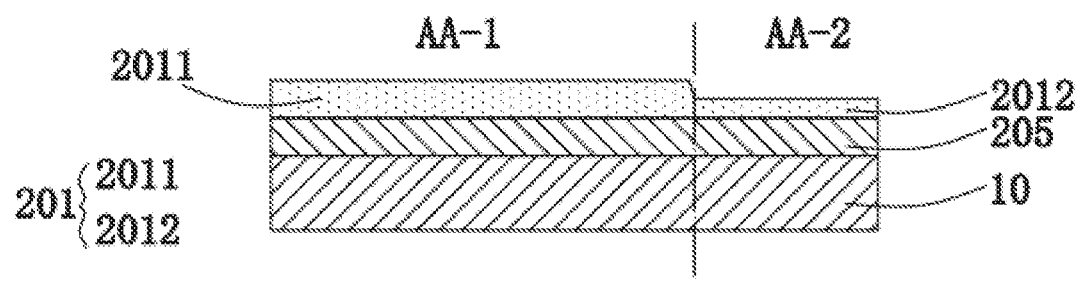

Specifically, as shown in FIG. 4C, two vacuum evaporation processes are performed on the buffer layer 205 to form the first metal film layer 2011 and the second metal film layer 2012, respectively. A shape of the first metal mask M1 is as shown in FIG. 5A. The shape of the first metal mask M1 is the same as a shape of the OLED display panel. A degree of light transmittance of an area of the first metal mask M1 corresponding to the first active area AA-1 is greater than the degree of light transmittance of an area of the first metal mask M1 corresponding to the second active area AA-2, such that the thickness of the second metal film layer 2012 is less than the thickness of the first metal film layer 2011 to increase light transmittance of the second metal film layer 2012, thereby increasing light transmittance of a cathode structure 20 corresponding to the second active area AA-2.

Figure 4D:
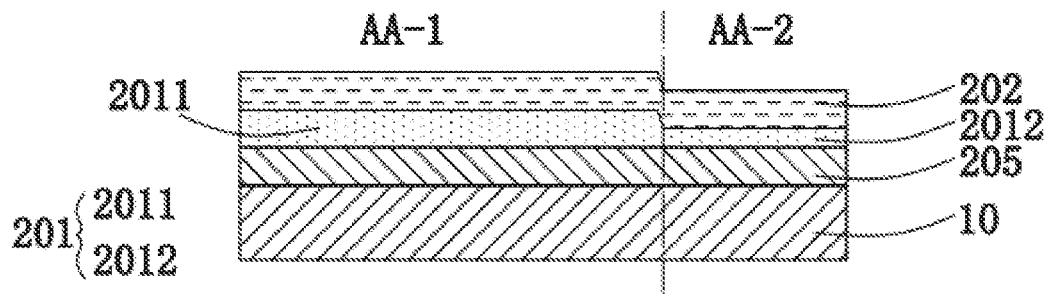

Furthermore, as shown in FIG. 4D, the manufacturing method of the OLED display panel further includes a step S30 of forming a conductive film layer 202 on the first metal film layer 2011 and the second metal film layer 2012 by physical vapor deposition method (PVD). Specifically, a thickness of the conductive film layer 202 is 50-5000 Å. The conductive film layer 202 is a transparent metal oxide film. A material of the conductive film layer 202 may be indium tin oxide, indium oxide-zinc oxide composite, aluminum-doped zinc oxide, molybdenum-doped zinc oxide, and one or more combination thereof. Other types of transparent conductive oxides may also be used.

Figure 4E:
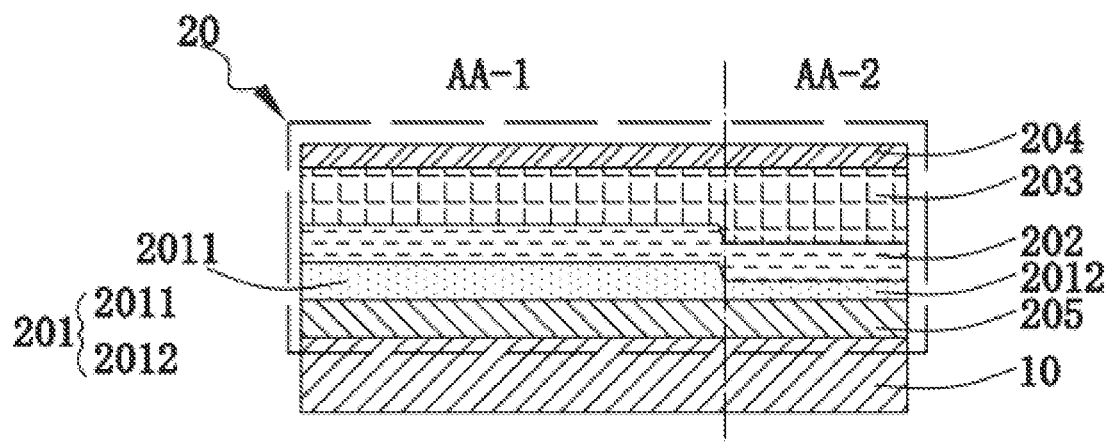

Furthermore, as shown in FIG. 4E, the manufacturing method of the OLED display panel further includes a step S40 of forming an optical compensation film layer 203 and a cover film layer 204 on the conductive film layer 202 in sequence. The buffer layer 205, the metal film layer 201, the conductive film layer 202, the optical compensation film layer 203, and the cover film layer 204 jointly form the cathode structure 20. Specifically, the optical compensation film layer 203 is formed on the conductive film layer 202 to increase brightness of light. The cover film layer 204 is formed on the optical compensation film layer 203 to protect the cathode structure 20 from damage, and further planarize the cathode structure 20.

Embodiment III

An embodiment of the present disclosure further provides an OLED display device, which may be any product or component having a display function, such as a mobile phone, a tablet computer, a television, a digital camera, etc. The OLED display device includes the OLED display panel of the above Embodiment I. The OLED display panel is manufactured using the manufacturing method of the Embodiment II and has the technical effects of the OLED display panel. The details are not described herein again.

Beneficial effects are: different regions of the metal film layer in the cathode structure are adjusted to different thicknesses, and the conductive film layer is added to compensate for conductivity of the metal film layer, so that the OLED display panel, the manufacturing method thereof, and the OLED display device can achieve different light transmittances in different regions and achieve conductivity of the existing cathode structure. In addition, the cathode structure can be applied to under-screen camera technologies, which is beneficial to increase screen-to-body ratio of the OLED display.

In summary, although the present disclosure has been described with preferred embodiments thereof, the above preferred embodiments are not used to limit the present disclosure. A person of ordinarily skill in the art can carry out changes and modifications to the described embodiments without departing from the scope and the spirit of the present disclosure, which is intended to be limited only by the appended claims.

What is claimed is:

1. An organic light-emitting diode (OLED) display panel, comprising a first active area and a second active area adjacent to the first active area, wherein the first active area is a main structure of the OLED display, the second active area corresponds to a position of a functional device of the OLED display panel, and the OLED display panel comprises an array substrate and a cathode structure that is disposed on the array substrate;

wherein the cathode structure comprises a metal film layer, the metal film layer comprises a first metal film layer and a second metal film layer, the first metal film layer is positioned within the first active area, the second metal film layer is positioned within the second active area, at least the second metal film layer of the metal film layer is subjected to a thinning treatment, and a thickness of the second metal film layer is less than or equal to a thickness of the first metal film layer.

2. The OLED display panel according to claim 1, wherein the cathode structure further comprises a conductive film layer disposed on the first metal film layer and the second metal film layer.

3. The OLED display panel according to claim 2, wherein a thickness of the conductive film layer is 50-5000 Å.

4. The OLED display panel according to claim 2, wherein the cathode structure further comprises an optical compensation film layer and a cover film layer that are laminated on the conductive film layer in sequence.

5. The OLED display panel according to claim 1, wherein the cathode structure further comprises a buffer layer disposed at a bottom of the first metal film layer and the second metal film layer, and the buffer layer corresponds to the first active area and the second active area.

6. The OLED display panel according to claim 1, wherein the functional device comprises a camera that is disposed at a back of the second active area.

7. The OLED display panel according to claim 1, wherein a thickness of the first metal film layer is 50-300 Å, and a thickness ratio of a thickness of the second metal film layer to the thickness of the first metal film layer is between 0.1% to 99.9%.

8. The OLED display panel according to claim 1, wherein a shape of the second active area is a notch, a U shape, or a water-drop shape.

9. The OLED display panel according to claim 1, wherein the OLED display further comprises a flexible circuit board, on which an integrated circuit chip is disposed.

10. A manufacturing method of an organic light-emitting diode (OLED) display panel, comprising:
   a step S10 of forming an array substrate that comprises an adjacent first active area and a second active area; and
   a step S20 of forming a first metal film layer and a second metal film layer on the array substrate using a first metal mask by thermal evaporation or electron beam evaporation technique in vacuo, wherein the first metal film layer and the second metal film layer jointly form a metal film layer, the first metal film layer is positioned within the first active area, the second metal film layer is positioned within the second active area, and at least the second metal film layer of the metal film layer is subjected to a thinning treatment so that a thickness of the second metal film layer is less than or equal to a thickness of the first metal film layer.

11. The manufacturing method of the OLED display panel according to claim 10, further comprising a step S30 of forming a conductive film layer on the first metal film layer and the second metal film layer by physical vapor deposition method.

12. The manufacturing method of the OLED display panel according to claim 11, wherein a material of the conductive film layer is selected from the group consisting of indium tin oxide, indium oxide-zinc oxide composite, aluminum-doped zinc oxide, molybdenum-doped zinc oxide, and a combination thereof.

13. The manufacturing method of the OLED display panel according to claim 11, further comprising a step S40 of forming an optical compensation film layer and a cover film layer on the conductive film layer in sequence.

14. The manufacturing method of the OLED display panel according to claim 10, wherein the step S10 further comprises:
   a step S101 of forming a buffer layer on the array substrate using a second metal mask by thermal evaporation or electron beam evaporation technique in vacuo, wherein the buffer layer corresponds to the first active area and the second active area.

15. The manufacturing method of the OLED display panel according to claim 10, wherein the buffer layer is made of metallic silver, metallic germanium, metallic magnesium, or metallic aluminum.

16. An organic light-emitting diode (OLED) display device, comprising an OLED display panel, wherein the OLED display panel comprises a first active area and a second active area adjacent to the first active area, the first active area is a main structure of the OLED display, the second active area corresponds to a position of a functional device of the OLED display panel, and the OLED display panel comprises an array substrate and a cathode structure that is disposed on the array substrate;
   wherein the cathode structure comprises a metal film layer, the metal film layer comprises a first metal film layer and a second metal film layer, the first metal film layer is positioned within the first active area, the second metal film layer is positioned within the second active area, at least the second metal film layer of the metal film layer is subjected to a thinning treatment, and a thickness of the second metal film layer is less than or equal to a thickness of the first metal film layer.

17. The OLED display device according to claim 16, wherein the cathode structure further comprises a conductive film layer disposed on the first metal film layer and the second metal film layer.

18. The OLED display device according to claim 17, wherein the cathode structure further comprises an optical compensation film layer and a cover film layer that are laminated on the conductive film layer in sequence.

19. The OLED display device according to claim 16, wherein the cathode structure further comprises a buffer layer disposed at a bottom of the first metal film layer and the second metal film layer, and the buffer layer corresponds to the first active area and the second active area.

20. The OLED display device according to claim 16, wherein the functional device comprises a camera that is disposed at a back of the second active area.

* * * * *